(12) United States Patent  
Kawabata

(10) Patent No.: US 9,035,442 B2
(45) Date of Patent: May 19, 2015

(54) SEMICONDUCTOR MODULE

(75) Inventor: Takeshi Kawabata, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 42 days.

(21) Appl. No.: 12/976,307

(22) Filed: Dec. 22, 2010

(65) Prior Publication Data

US 2011/0156271 A1     Jun. 30, 2011

(30) Foreign Application Priority Data

Dec. 28, 2009 (JP) ................................ 2009-297382
Nov. 22, 2010 (JP) ................................ 2010-259621

(51) Int. Cl.
*H01L 23/48* (2006.01)
*H01L 25/10* (2006.01)
*H01L 23/498* (2006.01)
*H01L 23/00* (2006.01)
*H01L 25/065* (2006.01)

(52) U.S. Cl.
CPC ..... *H01L 23/49838* (2013.01); *H01L 23/49816* (2013.01); *H01L 23/49822* (2013.01); *H01L 23/49827* (2013.01); *H01L 24/17* (2013.01); *H01L 25/0657* (2013.01); *H01L 2224/13099* (2013.01); *H01L 2225/06517* (2013.01); *H01L 2225/0652* (2013.01); *H01L 2225/06572* (2013.01); *H01L 2225/06589* (2013.01); *H01L 2924/01013* (2013.01); *H01L 2924/01029* (2013.01); *H01L 2924/01033* (2013.01); *H01L 2924/01078* (2013.01); *H01L 2924/01079* (2013.01); *H01L 2924/01082* (2013.01); *H01L 2924/01005* (2013.01); *H01L 2924/01006* (2013.01); *H01L 2924/014* (2013.01); *H01L 2224/16225* (2013.01); *H01L 2224/32225* (2013.01); *H01L 2224/73204* (2013.01); *H01L 2924/15311* (2013.01); *H01L 2924/15331* (2013.01)

(58) Field of Classification Search
USPC ................ 257/686, 723, 774, 777, 778, 786
IPC ........................ H01L 23/49838,24/17, 25/0657
See application file for complete search history.

(56) References Cited

U.S. PATENT DOCUMENTS 6,828,665 B2 * 12/2004 Pu et al. ........................ 257/686
7,087,989 B2    8/2006 Nakayama
(Continued)

FOREIGN PATENT DOCUMENTS

JP      62-258085      11/1987
JP      2004-265955    9/2004
(Continued)

*Primary Examiner* — Marcos D Pizarro
(74) *Attorney, Agent, or Firm* — Hamre, Schumann, Mueller & Larson, P.C.

(57) ABSTRACT

A semiconductor module having a second semiconductor package 200 mounted on a first semiconductor package 100, wherein the first semiconductor package 100 includes: pads 15 formed on the top surface of the first semiconductor package 100; external connection terminals 2 formed on the underside of the first semiconductor package 100, and vias 18 electrically connecting the pads 15 and the connection terminals 2. In a radiographic plane viewed in a vertical direction relative to one surface of a second substrate 25 of the second semiconductor package 200, the via 18 overlaps one of the pad 15 and the connection terminal 2, the pad 15 and the connection terminal 2 overlap each other, and the pad 15 has the center position outside the connection terminal 2.

18 Claims, 14 Drawing Sheets

(56) References Cited

U.S. PATENT DOCUMENTS

| | | | |
|---|---|---|---|
| 7,550,857 B1* | 6/2009 | Longo et al. | 257/777 |
| 2002/0043396 A1 | 4/2002 | Morimoto et al. | |
| 2006/0118937 A1 | 6/2006 | Katagiri et al. | |
| 2007/0187810 A1 | 8/2007 | Mok et al. | |
| 2008/0203584 A1* | 8/2008 | Katagiri et al. | 257/777 |
| 2008/0258289 A1* | 10/2008 | Pendse et al. | 257/690 |
| 2009/0127688 A1 | 5/2009 | Lee et al. | |
| 2009/0147490 A1 | 6/2009 | Kawabata | |
| 2010/0084177 A1 | 4/2010 | Kumakura | |

FOREIGN PATENT DOCUMENTS

| | | |
|---|---|---|
| JP | 2004-363126 | 12/2004 |
| JP | 2007-134927 | 5/2007 |
| JP | 2008-294014 | 12/2008 |
| JP | 2009-147397 | 7/2009 |

* cited by examiner (a)

(b)

(a)

(b)

SEMICONDUCTOR MODULE

FIELD OF THE INVENTION

The present invention relates to a semiconductor module in which a plurality of semiconductor packages are stacked.

BACKGROUND OF THE INVENTION

Electronic equipment such as a cellular phone and a digital camera has been requested to be reduced in size with higher functionality. Accordingly, semiconductor modules in which semiconductor devices and chips are stacked and combined (Package on Package (PoP)) have been particularly developed for electronic components. In PoP mounting, it has been necessary to improve the connection yields of upper and lower packages in response to higher density and improve the sensitivity of inspection in response to higher functionality. Accordingly, it has been requested to enhance inspection yields by improved quality.

Patent document 1 (Japanese Patent Laid-Open No. 2004-363126) describes a laminated structure as a known semiconductor module of the related art.

FIGS. 17A and 17B show patent document 1 (Japanese Patent Laid-Open No. 2004-363126).

A semiconductor package 200 is stacked and mounted on a semiconductor package 100. On the underside of the semiconductor package 100, connection terminals 2 are disposed. On the top surface of the semiconductor package 100, connection terminals 1 are disposed. In a non-defective product, the connection terminals 1 are joined onto connection pads 3 formed on the top surface of the semiconductor package 100. The connected surfaces of the connection terminals 1 and 2 are similarly shaped like circles and the connection pads 3 are also circular in shape. In this configuration, the layouts of the semiconductor packages 100 and 200 are optimized regardless of the layouts of the connection terminals 1 and 2. In a transparent image of the semiconductor module observed from above, the connection terminals 1 and 2 mostly overlap each other.

Patent document 2 (Japanese Patent Laid-Open No. 2008-294014) describes a known example of stacked printed circuit boards, each having a semiconductor package mounted thereon. FIGS. 18A, 18B, and 18C show patent document 2 (Japanese Patent Laid-Open No. 2008-294014).

In the example of FIG. 18A, printed circuit boards 100a and 100b are stacked. On electrode pads 30b of the upper printed circuit board 100b, a semiconductor package 1b is mounted via melted and solidified ball electrodes 10b. On electrode pads 30a of the lower printed circuit board 100a, a semiconductor package 1a is mounted via melted and solidified ball electrodes 10a.

FIG. 18B is a plan view showing the electrode pads 30b and FIG. 18C is a plan view showing the electrode pads 30a. In a transparent image of the stacked printed circuit boards 100a and 100b that are observed from above, the electrode pads 30a and 30b have projecting portions in the planar direction and are oriented in opposite directions such that the electrode pads do not overlap each other.

DISCLOSURE OF THE INVENTION

Generally, connections between upper and lower semiconductor packages are checked by electrical inspections. In other words, in addition to inspections on individual packages, finished modules are generally inspected again to check connections between upper and lower semiconductor packages and offer electrical guarantees.

In such an inspection, the semiconductor module of FIG. 17A is inserted in the socket of testing equipment, the connection terminals 2 of the semiconductor package 100 are brought into contact with the probe of the socket by applying a load from the top of the semiconductor module, and continuity at the joints of the semiconductor package 100 and the semiconductor package 200 is checked through the internal wiring of the semiconductor module.

In such an electrical inspection, however, when the semiconductor package 100 and the semiconductor package 200 are in slight contact but are not firmly joined to each other, a load applied in the inspection may temporarily enable continuity at the joints of the semiconductor package 100 and the semiconductor package 200, so that it may be decided that the joints are "electrically continuous" and the packages may pass the inspection.

Therefore, it is necessary to check not only whether the upper and lower connection terminals are in contact but also whether the upper and lower connection terminals are physically joined to each other in a continuous manner. For this purpose, noncontact transmission inspections such as an X-ray inspection and an ultrasonic inspection (Scanning Acoustic Tomograph (SAT)) are used.

In such a transmission inspection, however, a visual check is extremely time consuming and a threshold value is hard to set even in automatic decision. Consequently, it is quite difficult to check whether the packages are joined to each other.

To be specific, in patent document 1 shown in FIGS. 17A and 17B, the connection terminals 1 and the connection terminals 2 at the bottom are spherical in the vertical direction. The positions of the connection terminals are not specified and the connection terminals mostly overlap each other. Thus in an X-ray transparent image from above, as shown in FIG. 17B, the connection terminals 1 and the connection terminals 2 are similarly shaped like circles and overlap each other, so that joining between the upper and lower packages cannot be confirmed.

Further, when the connection terminals are not joined or contacted between the upper and lower semiconductor packages, the connection terminals 1 do not widely spread on the surfaces of the connection pads 3. Thus the connection terminals 1 should be circular in shape and differently sized from the connected surfaces. Also in this case, however, the connection terminals 1 mostly overlap the external connection terminals at the bottom in a transmission inspection and thus an unbonded state cannot be distinguished from a joined state.

In patent document 2 shown in FIGS. 18A, 18B, and 18C, the electrode pads 30a and 30b of the printed circuit boards have projecting portions in plan view and the projecting portions do not overlap each other in a transparent image taken from above. However, the molten ball electrodes 10a and 10b are deformed according to the shapes of the projecting electrode pads 30a and 30b, so that the melted and solidified ball electrodes 10a and 10b form asymmetrically deformed connection terminals.

Hence, after the printed circuit boards are joined to each other, the unbalanced shapes are subject to a stress concentration in a certain direction because of an environmental change and a temperature change during use, so that a stress may be unevenly distributed and the reliability may decrease.

An object of the present invention is to provide a semiconductor module in which a joint can be easily checked with reliability by a nondestructive inspection. Another object of the present invention is to provide a semiconductor module that can be improved in quality and reliability while symmetrically keeping the basic circular shapes of terminals.

A semiconductor module of the present invention includes: a first semiconductor package; and a second semiconductor package, the first semiconductor package including: a first substrate; a first semiconductor chip on one surface of the first substrate; inter-substrate connection pads on the one surface of the first substrate; external connection terminals on the other surface of the first substrate; and vias electrically connecting the pads and the connection terminals, the second semiconductor package including: a second substrate; a second semiconductor chip on one surface of the second substrate; and inter-substrate joints provided on the other surface of the second substrate so as to be connected to the pads, wherein in a radiographic plane viewed in a vertical direction relative to the one surface of the second substrate, the via overlaps one of the pad and the connection terminal, the pad and the connection terminal overlap each other, and the pad has the center position outside the connection terminal.

A semiconductor module of the present invention includes: a first semiconductor package; and a second semiconductor package, the first semiconductor package including: a first substrate; a first semiconductor chip on one surface of the first substrate; inter-substrate connection pads on the one surface of the first substrate; external connection terminals on the other surface of the first substrate; and vias electrically connecting the pads and the connection terminals, the second semiconductor package including: a second substrate; a second semiconductor chip on one surface of the second substrate; and inter-substrate joints provided on the other surface of the second substrate so as to be connected to the pads, wherein in a radiographic plane viewed in a vertical direction relative to the one surface of the second substrate, the via overlaps one of the pad and the connection terminal, the pad and the connection terminal overlap each other, and the connection terminal has the center position outside the pad.

A semiconductor module of the present invention includes: a first semiconductor package; and a second semiconductor package, the first semiconductor package including: a first substrate; a first semiconductor chip on one surface of the first substrate; inter-substrate connection pads on the one surface of the first substrate; external connection terminals on the other surface of the first substrate; and vias electrically connecting the pads and the connection terminals, the second semiconductor package including: a second substrate; a second semiconductor chip on one surface of the second substrate; and inter-substrate joints provided on the other surface of the second substrate so as to be connected to the pads, wherein in a radiographic plane viewed in a vertical direction relative to the one surface of the second substrate, the via overlaps one of the pad and the connection terminal, the pad and the connection terminal overlap each other, the pad has the center position outside the connection terminal, and the connection terminal has the center position outside the pad.

A semiconductor module of the present invention includes: a first semiconductor package; and a second semiconductor package, the first semiconductor package including: a first substrate; a first semiconductor chip on one surface of the first substrate; inter-substrate connection pads on the one surface of the first substrate; external connection terminals on the other surface of the first substrate; and vias electrically connecting the pads and the connection terminals, the second semiconductor package including: a second substrate; a second semiconductor chip on one surface of the second substrate; and inter-substrate joints provided on the other surface of the second substrate so as to be connected to the pads, wherein in the first substrate, the via electrically connecting the pad and the connection terminal is contained in the pad and the connection terminal when viewed from the one surface of the second substrate in a vertical direction, and in a radiographic plane viewed in the vertical direction relative to the one surface of the second substrate, the via overlaps one of the pad and the connection terminal, the inter-substrate joint has the center displaced from the center of the connection terminal, and the connection terminal is contained in the inter-substrate joint.

With this configuration, it is possible to easily check a bonded state and decide the presence or absence of a faulty joint in an inspection on the joints of the lower first semiconductor package and the upper second semiconductor package, thereby achieving a reliable inspection. Thus it is possible to provide a semiconductor module with high quality and reliability.

DESCRIPTION OF THE EMBODIMENTS

Prior to the explanation of embodiments of the present invention, a typical basic structure of a semiconductor module will be described below in accordance with FIGS. 1, 2A, and 2B. In these drawings, the shapes of terminals, electrodes, and wires are omitted or simplified and the number of terminals, electrodes, and wires is determined for simplicity. Also in the subsequent drawings, terminals, electrodes, and wires are illustrated in a similar manner.

—Basic Structure—

Figure 1:
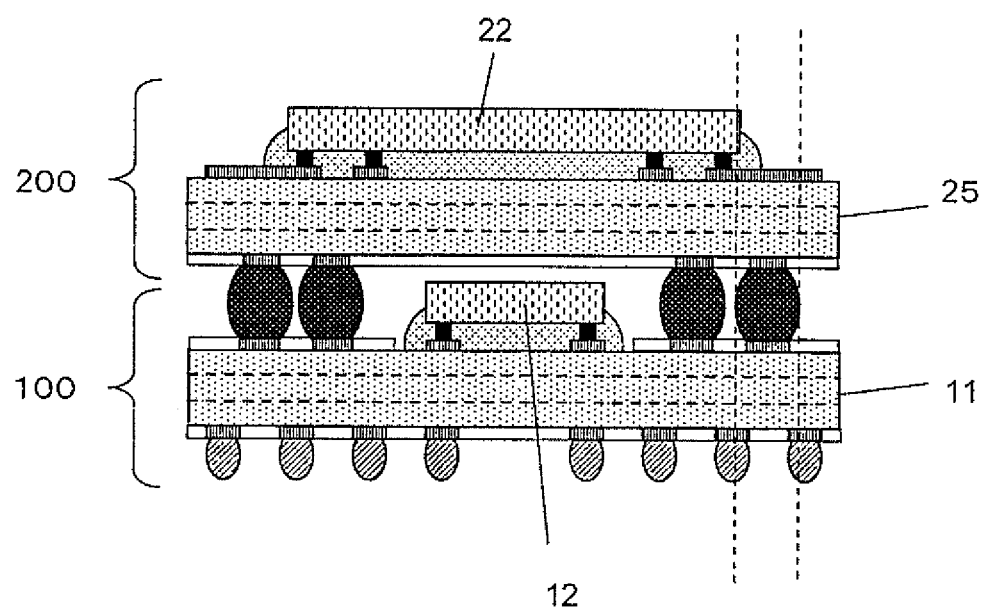
FIG. 1 is a sectional view showing a typical basic structure of a semiconductor module.

FIG. 1 shows a typical basic structure of a semiconductor module.

A semiconductor package 200 is stacked and mounted on a semiconductor package 100. Mounted on the top surface of a substrate 11 of the semiconductor package 100 is a semiconductor chip 12. Mounted on the top surface of a substrate 25 of the semiconductor package 200 is a semiconductor chip 22.

Specifically, the semiconductor package 200 is, e.g., a general-purpose stacked memory device. The semiconductor chip 22 such as a memory is mounted on the substrate 25, and the electrodes of the semiconductor chip 22 are electrically connected to the electrodes of the substrate 25 by wire bonding or a flip-chip technique. The semiconductor package 200 may be molded with resin covering the semiconductor chip 22.

Figure 2A:
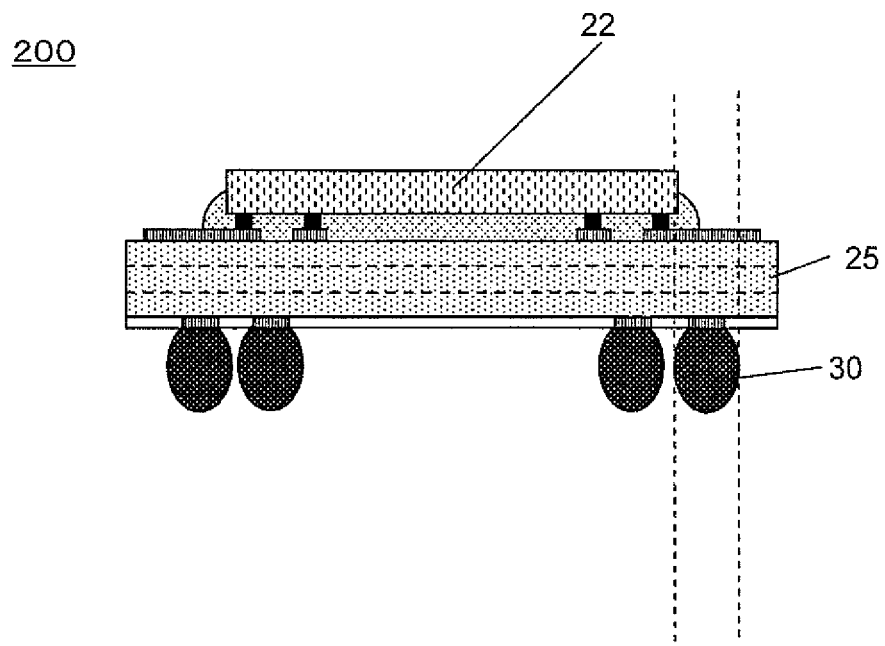
FIG. 2A is a sectional view showing an upper semiconductor package used for the semiconductor module of FIG. 1.
Figure 2B:
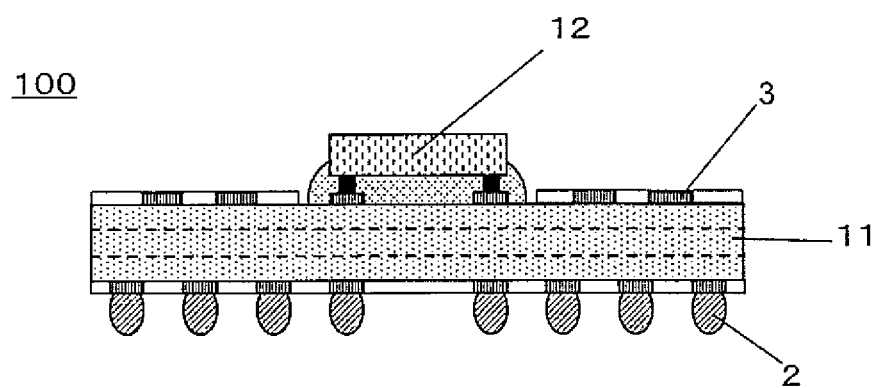
FIG. 2B is a sectional view showing a lower semiconductor package used for the semiconductor module of FIG. 1.

FIG. 2A shows the semiconductor package 200 and FIG. 2B shows the semiconductor package 100. On the underside of the semiconductor package 200, inter-substrate joints 30 are formed that join the semiconductor package 200 to the semiconductor package 100. The inter-substrate joints 30 are typically solder balls formed by using a solder material such as SnPb, SnAgCu, SnCu, and SuBi as a bonding metal.

First Embodiment

Figure 3:
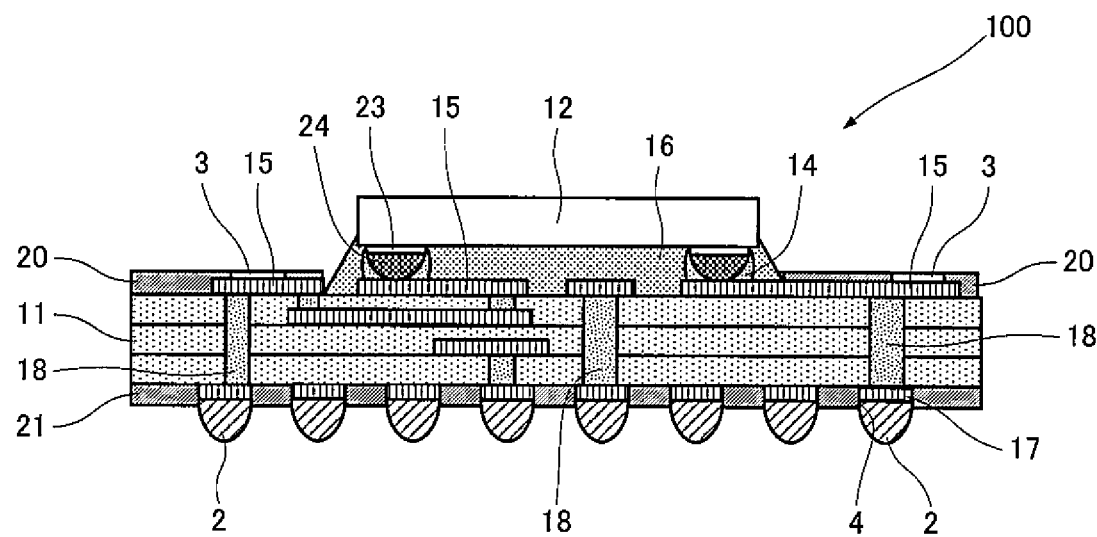
FIG. 3 is a sectional view showing a lower semiconductor package used for a semiconductor module according to an embodiment of the present invention.

In a semiconductor module according to an embodiment of the present invention, a semiconductor package 200 of FIG. 2A is stacked and mounted on a semiconductor package 100 of FIG. 3.

The semiconductor package 100 is made up of a substrate 11 and a semiconductor chip 12 mounted on the top surface of the substrate 11. Attached on the underside of the substrate 11 are connection terminals 2 for external connection.

Referring to FIG. 3, the semiconductor package 100 will be specifically described below.

In the semiconductor chip 12, an integrated circuit formation region (not shown) including a semiconductor element is provided at the center of a chip substrate that is rectangular in plan view and a plurality of chip terminals 23 are disposed outside the integrated circuit formation region. The chip terminals 23 are made of a metal used for forming the wiring of an integrated circuit, e.g., aluminum, copper, or a composite material of aluminum and copper. The surface of the semiconductor chip 12 is covered with an insulating film (not shown) made of a material such as polyimide, except for the region of the chip terminals 23. The chip terminals 23 have projecting electrodes 24 that are formed by a known method such as a wire bump technique and plating. The projecting electrode 24 preferably has a laminated body of at least one component made of solder, gold, copper, or nickel. Further, the projecting electrode 24 is preferably a spherical or cylindrical bump. The chip terminals 23 may be disposed in the integrated circuit formation region.

The substrate 11 has a multilayer wiring structure made of a material such as aramid resin, glass epoxy resin, polyimide resin, and ceramic. On the top surface of the substrate 11, pads 15 for connecting the substrates are formed at the respective positions of the projecting electrodes 24 provided on the semiconductor chip 12. On the underside of the substrate 11, pads 17 for connecting the substrates are formed. The pads 17 are partially covered with an insulating film 21 made of a material such as a solder resist and polyimide. The exposed parts of the pads 17 from the insulating film 21 serve as openings 4 for external connection. The connection terminals 2 are attached to the exposed parts of the pads 17 in the openings 4.

The semiconductor chip 12 is flip-chip mounted on the substrate 11 and the projecting electrodes 24 are electrically connected to the pads 15 with a conductive adhesive 14. Moreover, in order to reinforce the connection between the semiconductor chip 12 and the substrate 11, an underfill resin 16 fills a clearance between the semiconductor chip 12 and the substrate 11. The semiconductor chip 12 and the substrate 11 may be connected by, e.g., a connecting method using the hardening shrinkage of a nonconductive resin film instead of the underfill resin 16.

On the underside of the substrate 11, the connection terminals 2 for external connection are placed in a lattice fashion partially on the pads 17, the connection terminals 2 being electrically connectable to an external substrate (not shown). The connection terminals 2 are made of a solder material such as SnPb, SnAgCu, SnCu, and SuBi or the connection terminals 2 are shaped like balls made of a material such as gold, copper, and nickel. The connection terminals 2 can be melted and joined to the external substrate by reflow heating at the melting point or higher. Alternatively, the connection terminals 2 may be resin balls that are made conductive by, e.g., metal deposition on the surface layers.

Outside the hold region of the semiconductor chip 12 on the top surface of the substrate 11, the pads 15 are partially covered with an insulating film 20 made of a material such as a solder resist and polyimide. The exposed parts of the pads 15 from the insulating film 20 serve as substrate connecting openings 3 that connect the semiconductor package 100 to the semiconductor package 200.

To the pads 15 exposed in the openings 3, inter-substrate joints 30 are connected that are formed on the underside of the semiconductor package 200. The connected points of the pads 15 to the inter-substrate joints 30 are subjected to surface treatment such as nickel plating and gold plating to prevent oxidation.

Further, the substrate 11 includes vias 18 that electrically connect the pads 15 and the pads 17. The vias 18 are provided in parallel with the thickness direction of the substrate 11 and perpendicularly to the plane of the substrate 11. The vias 18 are desirably formed in the areas of intersection of the pads 15 and the pads 17 in the top view of the substrate 11. This is because in the measurement of a transparent image in an X-ray inspection conducted from above the substrate 11, the images of the vias 18 are contained in the areas of intersection and do not affect the inspection, thereby achieving a simple inspection.

Consequently, the pads 15 and 17 connected via the short vias 18 perpendicular to the substrate 11 can improve heat dissipation and achieve excellent electrical characteristics because of interconnections with the shortest distance. Further, since build-up multilayer interconnection is not necessary, the packages can be easily fabricated. Moreover, the interconnections with an equal length can reduce variations in characteristics among the interconnections in the case of a high-speed signal.

—Relationship Between the Inter-Substrate Joint 30 and the Connection Terminal 2—

Figure 4:
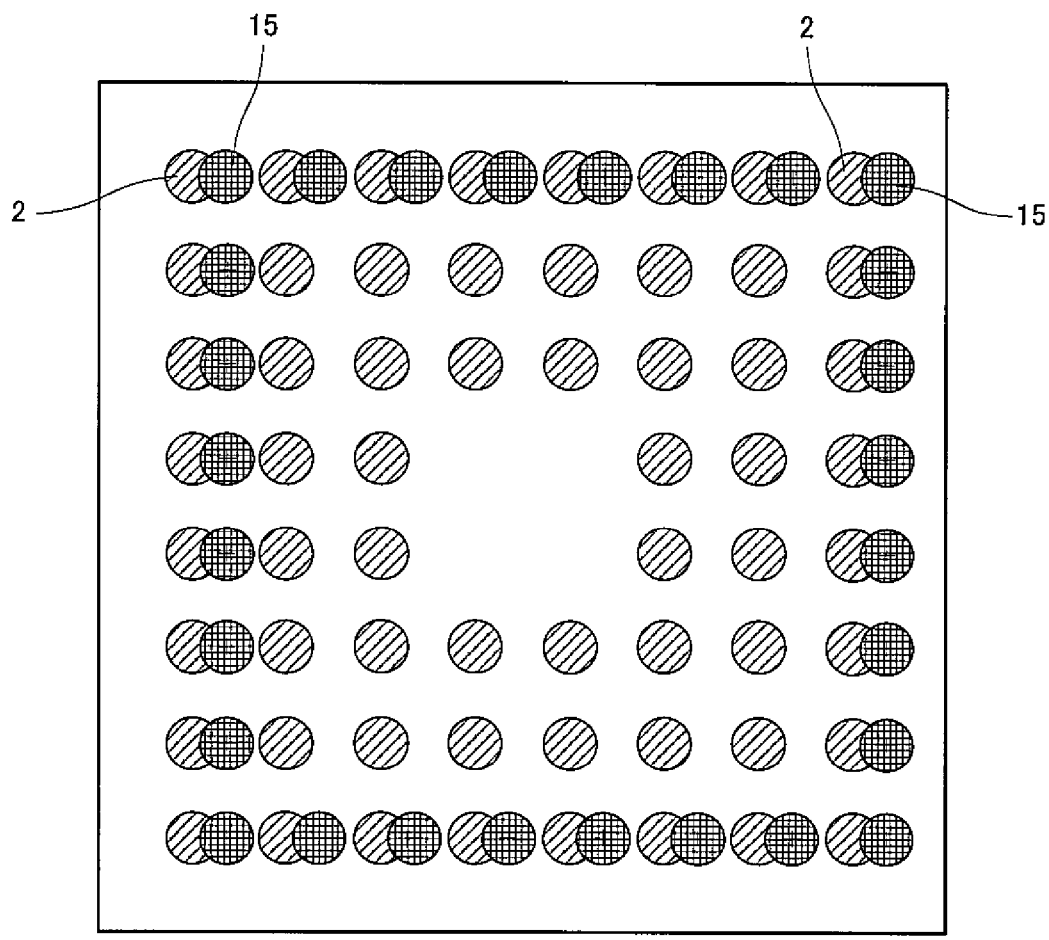
FIG. 4 is a plan view showing a projected state of a substrate 11 according to the embodiment of the present invention.
Figure 5:
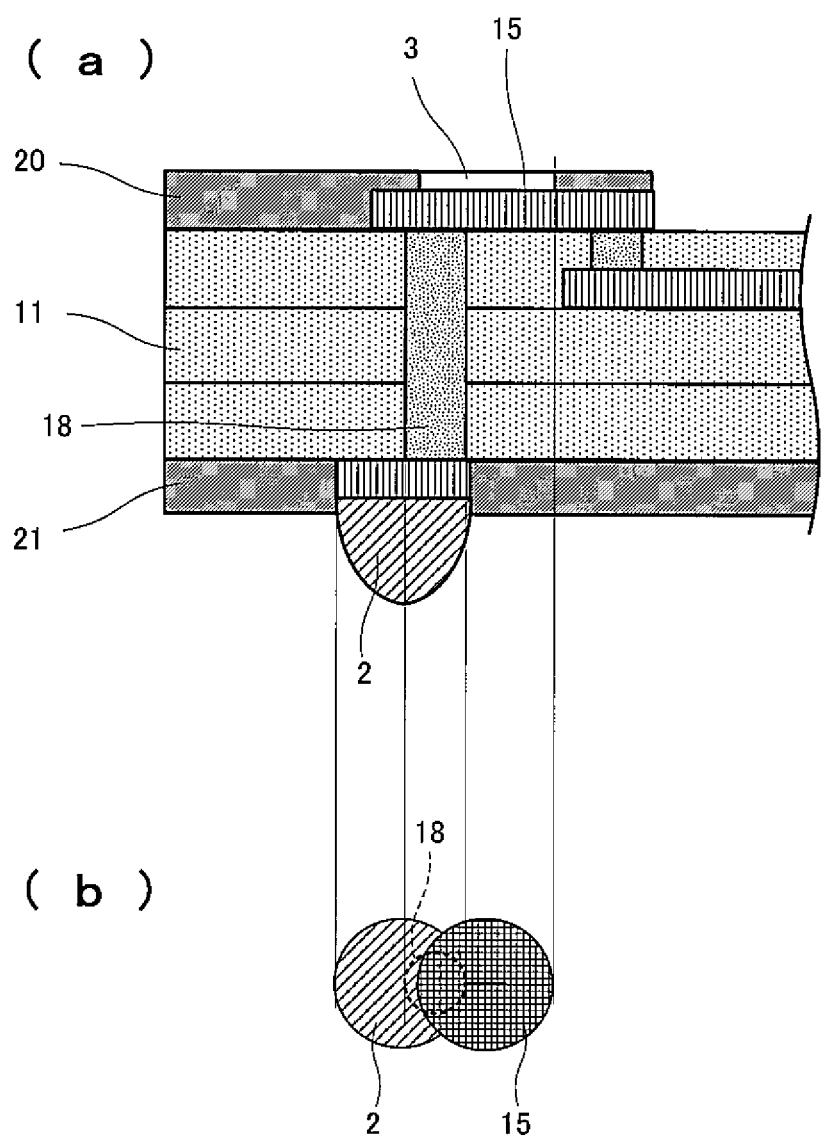
FIG. 5(a) is an enlarged view showing the principle part of FIG. 3.
FIG. 5(b) is an enlarged view showing the principle part of FIG. 4.

FIG. 4 is a projection drawing showing the pads 15 exposed from the openings 3 in addition to the connection terminals 2 on the substrate 11 of the semiconductor package 100. FIG. 5(a) is an enlarged view showing the principle part of FIG. 3. FIG. 5(b) is an enlarged view showing the principle part of FIG. 4.

In this configuration, the pads 15 exposed from the openings 3 and the connection terminals 2 are circular in plan view. A center S15 of the pad 15 exposed from the opening 3 is not hidden behind the connection terminal 2 in a transparent image viewed perpendicularly to one surface of the substrate 11, the one surface being extended in the horizontal direction. For example, a center distance between the pad 15 exposed from the opening 3 and the connection terminal 2 is set larger than the radius of the connection terminal 2. The pad 15 exposed from the opening 3 may be larger in size than the connection terminal 2.

The present embodiment features the positional relationship between the pad 15 exposed from the opening 3 and the connection terminal 2 and the sizes of the pad 15 and the connection terminal 2. Thus the connected state of the semiconductor package 100 and the semiconductor package 200 can be easily detected by a noncontact transmission inspection as will be described later.

The semiconductor package 200 of FIG. 2A is placed on the top surface of the semiconductor package 100 configured as shown in FIG. 3 and the inter-substrate joints 30 are melted and solidified by reflow heating at the melting point of the material of the inter-substrate joint 30 or higher. Thus the lower ends of the inter-substrate joints 30 are solder bonded to the pads 15 exposed from the openings 3 of the semiconductor package 100 and thus the semiconductor package 100 is electrically connected to the semiconductor package 200 via the inter-substrate joints 30.

The molten inter-substrate joints 30 are spread and solidified according to the shapes of the pads 15 exposed from the openings 3, so that the bottoms of the inter-substrate joints 30 are substantially identical in shape to the openings 3.

In such a normal joined state, the openings 3 are filled with the solidified components of the inter-substrate joints 30. Thus in a transparent image of the semiconductor module observed from above by, e.g., an X-ray apparatus, the bottoms of the inter-substrate joints 30 spread over the pads 15 exposed from the openings 3. Further, in the transparent image viewed from above in FIG. 4, the center S15 of the pad 15 exposed from the opening 3 is not hidden behind the connection terminal 2. Thus the radius of the bonded surface of the inter-substrate joint 30 can be confirmed in a transmission inspection.

Figure 6:
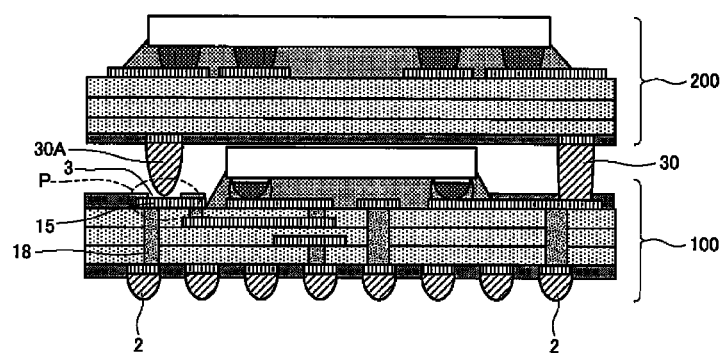
FIG. 6 is a sectional view showing an unbonded portion of the semiconductor module according to the embodiment of the present invention.
Figure 7:
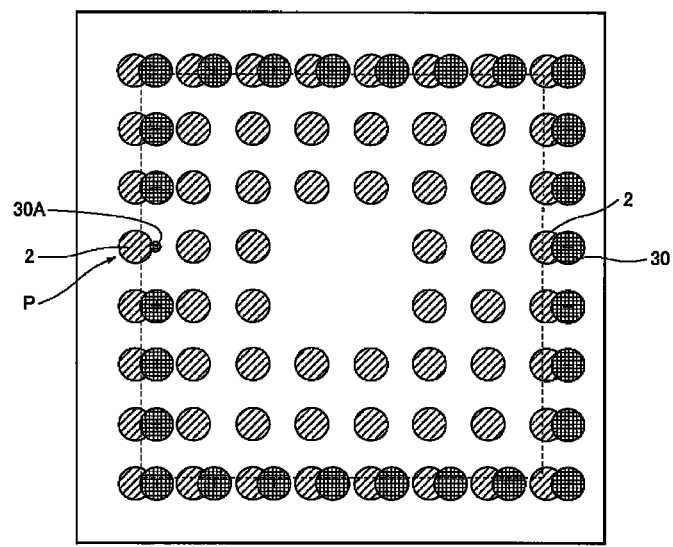
FIG. 7 is a plan view showing the semiconductor module of FIG. 6 as a transparent image viewed in the vertical direction.

In FIGS. 6 and 7, the semiconductor module has an unbonded portion.

In the event of a faulty joint P where an inter-substrate joint 30A failed to be applied as shown in the left part of FIG. 6, the bottom of the inter-substrate joint 30A does not spread over the pad 15 exposed from the opening 3, so that the bottom forms a circle substantially as large as the original shape of the inter-substrate joint 30A. When a transparent image of the semiconductor module having such a faulty joint is observed from above by, e.g., an X-ray apparatus, radiation easily penetrates the substrate 11 made of a resin material and the pads 15 having a small thickness of 10 μm to 20 μm are not clearly imaged, whereas in FIG. 7, the inter-substrate joint 30 having a larger thickness of, e.g., at least 100 μm forms an unbonded terminal image that is circular and smaller than the circle size of a normal joint.

As shown in FIGS. 6 and 7, it is confirmed that a normal joint (the inter-substrate joint 30) is as large as the circle of the molten and spread inter-substrate joint 30, that is, as large as the pad 15 exposed from the opening 3, whereas an unbonded point is substantially as large as the original size of the inter-substrate joint 30A and is smaller than the pad 15.

In this way, the faulty joint P can be recognized as a smaller circle than a normal joint, so that a connected state of the semiconductor package 100 and the semiconductor package 200 can be easily detected.

The semiconductor package 100 of FIG. 3 is used as a lower semiconductor package in the assembling of the semiconductor module, so that the semiconductor module can be improved in reliability only with a simple inspection process.

—Positional Relationship Between the Connection Terminal 2 and the Pad 15 Exposed from the Opening 3—

As has been discussed, since the center S15 of the pad 15 exposed from the opening 3 is not hidden behind the connection terminal 2, the radius of the bonded surface of the inter-substrate joint 30 can be confirmed by a transmission inspection. This point will be specifically described below.

Figure 8:
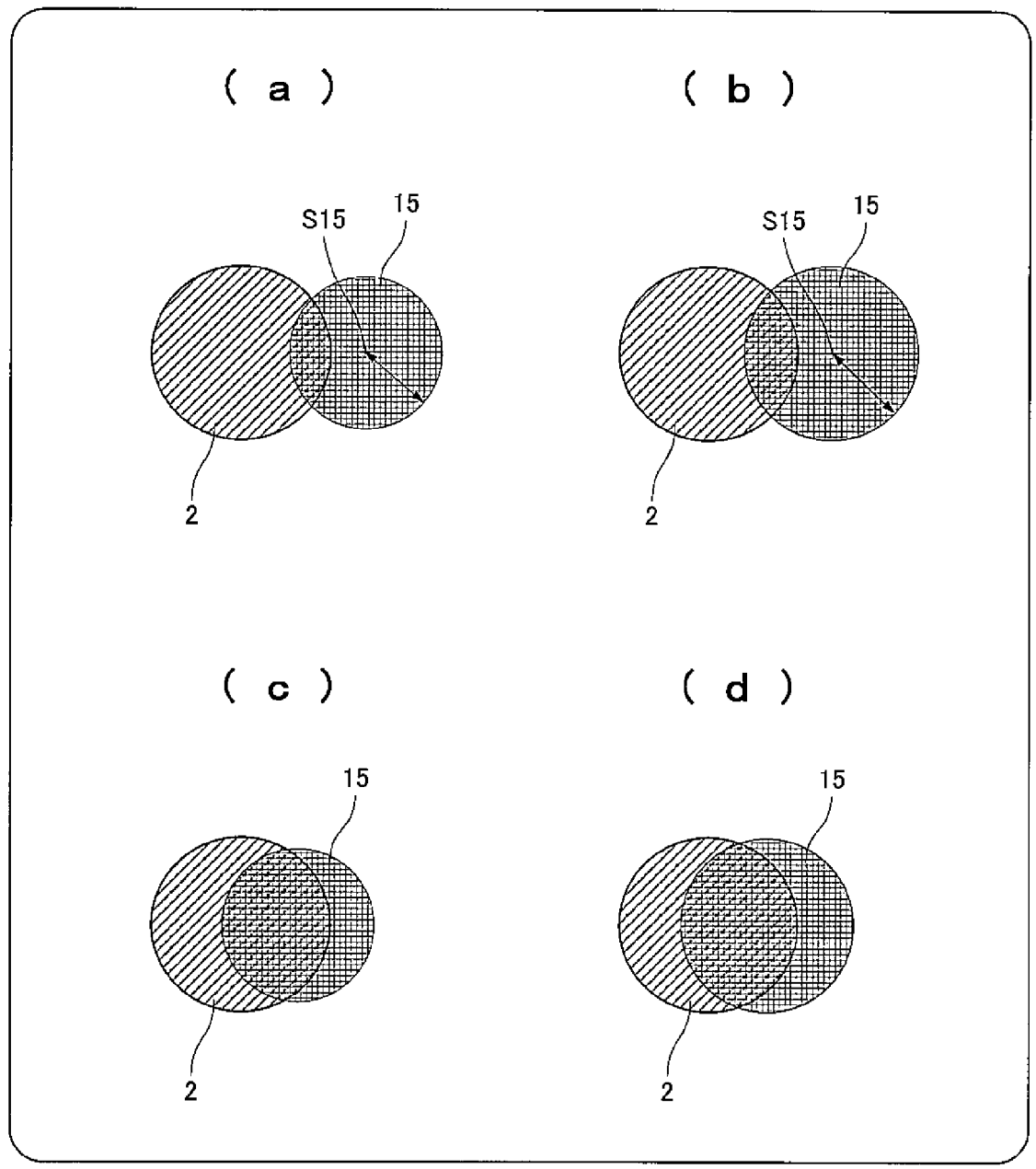
FIGS. 8(a) to 8(d) are enlarged plan views showing the layouts of openings according to the embodiment of the present invention.

FIGS. 8(a) and 8(b) show an example in which the center 815 of the pad 15 is not hidden behind the connection terminal 2. FIGS. 8(c) and 8(d) show another example in which the center S15 of the pad 15 overlaps the connection terminal 2.

In FIGS. 8(a) and 8(b), the center 815 of a black circle representing the pad 15 exposed from the opening 3 is not hidden behind the connection terminal 2. In this case, it is easily recognized by a visual check that the pad 15 of FIG. 8(a) is smaller than the pad 15 of FIG. 8(b).

In FIGS. 8(c) and 8(d), the center of the pad 15 exposed from the opening 3 overlaps the connection terminal 2 and the radius of the pad 15 cannot be recognized. Thus it is not easily recognized by a visual check that the pad 15 of FIG. 8(c) is smaller than the pad 15 of FIG. 8(d).

In other words, in order to recognize the size of the inter-substrate joint 30 spreading on the pad 15, the center of the pad 15 exposed from the opening 3 is preferably placed out of the connection terminal 2 in a direction parallel with the surface of the substrate 11 (in the horizontal direction).

Figure 9:
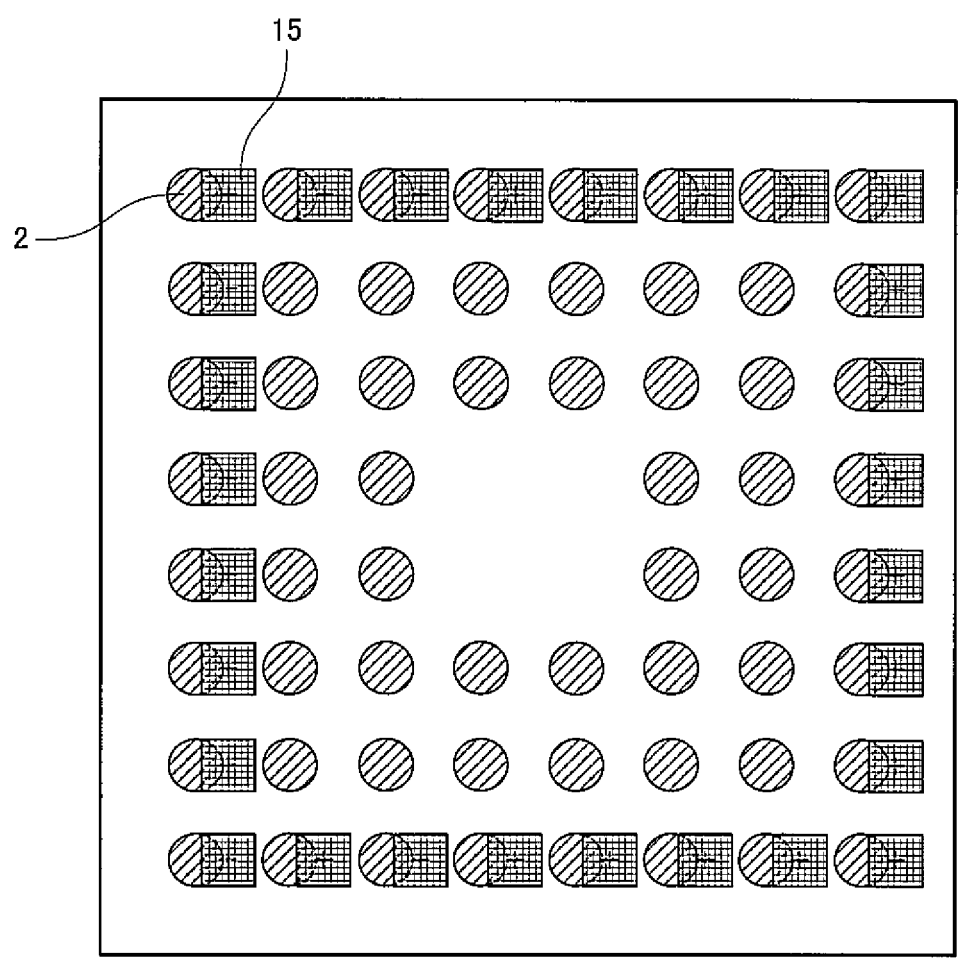
FIG. 9 is a plan view showing a lower semiconductor package as a transparent image viewed in the vertical direction according to another embodiment of the present invention.

In the present embodiment, the pad 15 exposed from the opening 3 may have a different shape from the connection terminal 2. FIG. 9 shows that the connection terminals 2 are circular and the pads 15 exposed from the openings 3 are quadrangles.

The connection terminal 2 and the pad 15 exposed from the opening 3 should not be completely separated from each other. As has been illustrated in FIG. 1, the vias 18 are connected to the connection terminals 2 and the pads 15 exposed from the openings 3 and thus the connection terminals 2 and the pads 15 have to at least partially overlap each other when viewed from the top surface of the substrate 11.

The inter-substrate joints 30 and the connection terminals 2 are preferably displaced from each other by a constant distance. Further, the inter-substrate joints 30 and the connection terminals 2 are preferably displaced in the same direction. The displacement by the constant distance is, for example, a state in which the inter-substrate joints 30 and the connection terminals 2 are displaced from each other by the same distance.

Moreover, the center of the pad 15 exposed from the opening 3 may not be contained in the connection terminal 2 in the direction parallel with the surface of the substrate 11 (in the horizontal direction). Further, the center of the connection terminal 2 may not be contained in the pad 15 exposed from the opening 3, in the direction parallel with the surface of the substrate 11 (in the horizontal direction). These arrangements are effective also in other examples of the present application.

—Size—

Figure 10:
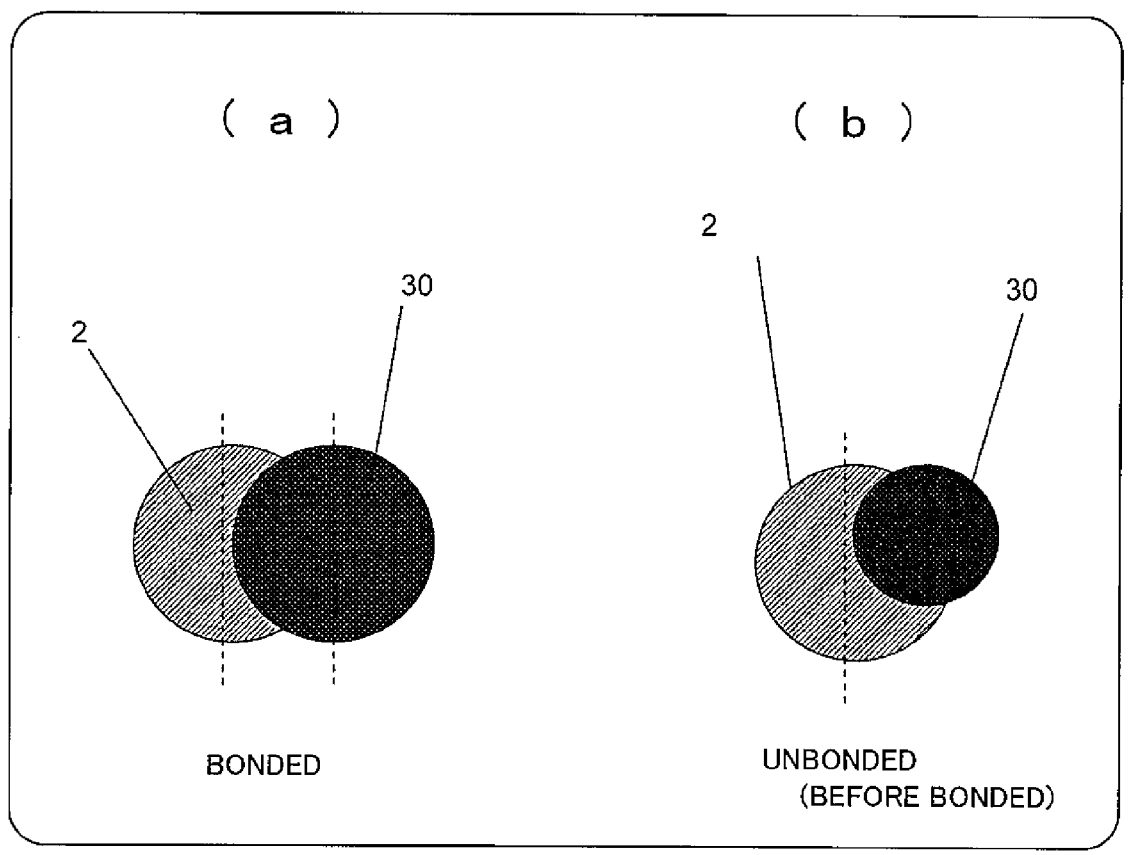
FIGS. 10(a) and 10(b) are terminal enlarged views showing the semiconductor module according to the embodiment of the present invention.

FIGS. 10(a) and 10(b) show an example in which the connection terminal 2 and the pad 15 exposed from the opening 3 have the same size.

When the inter-substrate joint 30 is normally bonded to the pad 15 exposed from the opening 3, as shown in FIG. 10(a), the connection terminal 2 and the inter-substrate joint 30 are recognized as circles of the same size. In the case of a faulty joint, as shown in FIG. 10(b), the connection terminal 2 and the inter-substrate joint 30 are recognized as two circles of different sizes.

Comparing these states, a faulty joint can be recognized at first sight because of the visible center position of the inter-substrate joint 30 in the opening and a relative difference of a faulty joint from the neighboring connection terminal 2.

Second Embodiment

Relationship Between the Inter-Substrate Joint 30 and the Connection Terminal 2

FIGS. 11 to 14 show, as a modification of the present embodiment, a sectional view of a lower semiconductor package 100 of a semiconductor module, a sectional view of the semiconductor module, a plan view of a transmission inspection, a detection example of a faulty joint, and a detection example of a normal joint.

Figure 11:
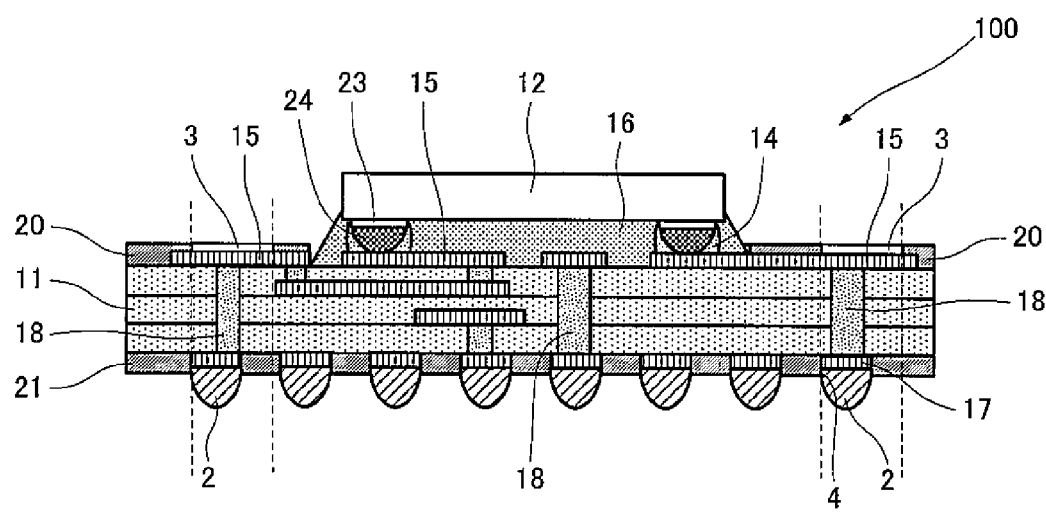
FIG. 11 is a sectional view showing a lower semiconductor package used for a semiconductor module according to another embodiment of the present invention.

As shown in FIG. 11, the center of the diameter of a pad 15 exposed from an opening 3 and the center of a connection terminal 2 may be displaced from each other and the connection terminal 2 may be hidden behind (contained in) the pad 15 exposed from the opening 3.

In a state in which inter-substrate joints 30 are mounted on the lower semiconductor package before melting, the inter-substrate joints 30 are placed out of the connection terminals 2 in a transparent image from the top of the semiconductor package.

Figure 12:
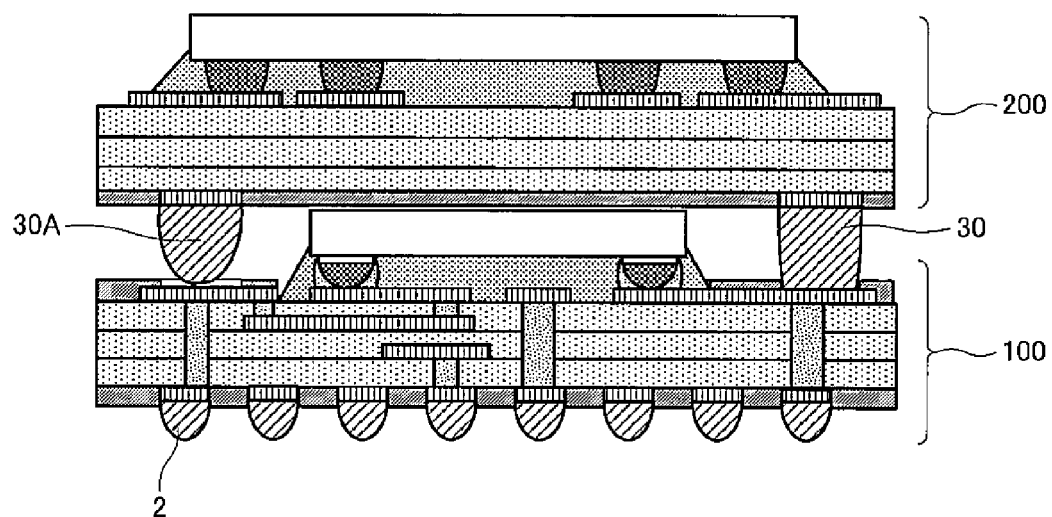
FIG. 12 is a sectional view showing the semiconductor module using the lower semiconductor package of FIG. 11.

Further, in the stacked state of FIG. 12, the diameter of the inter-substrate joint 30 is smaller than that of the connection terminal 2. Thus in a bonded state, the connection terminals 2 are hidden behind the inter-substrate joints 30, so that only the shapes of the inter-substrate joints 30 with molten and spread solder can be confirmed in a transmission inspection conducted from above the semiconductor package.

Figure 13:
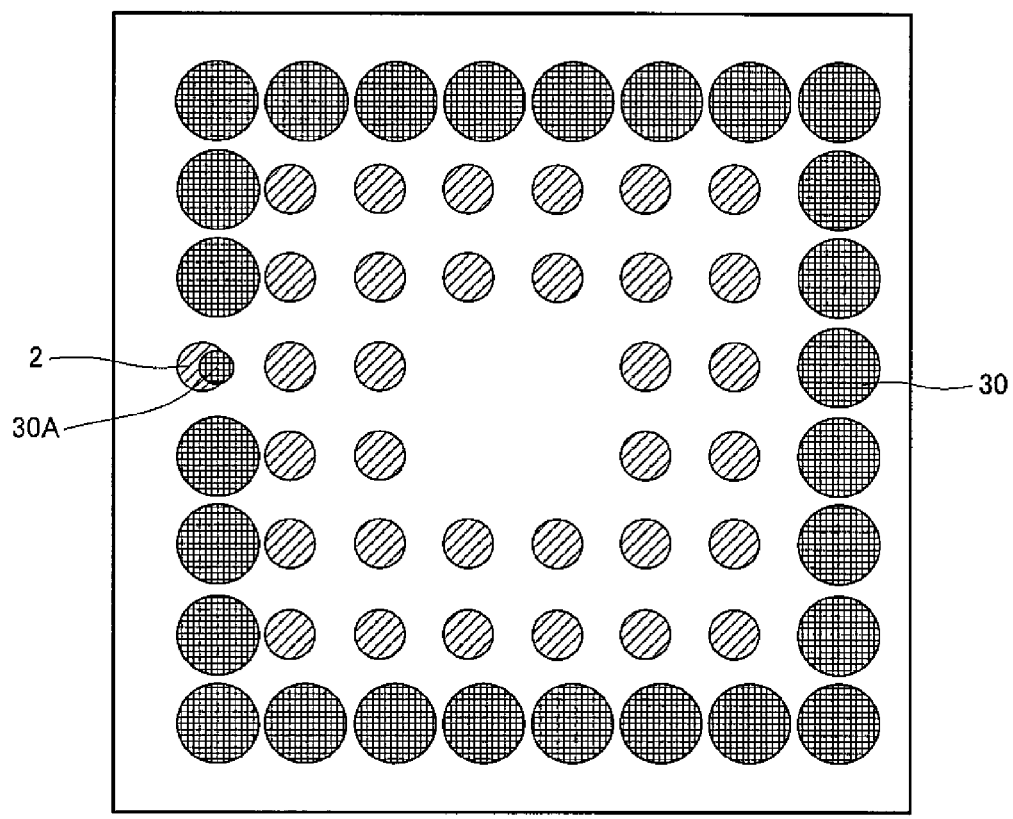
FIG. 13 is a plan view showing the semiconductor module of FIG. 12 as a transparent image viewed in the vertical direction.
Figure 14:
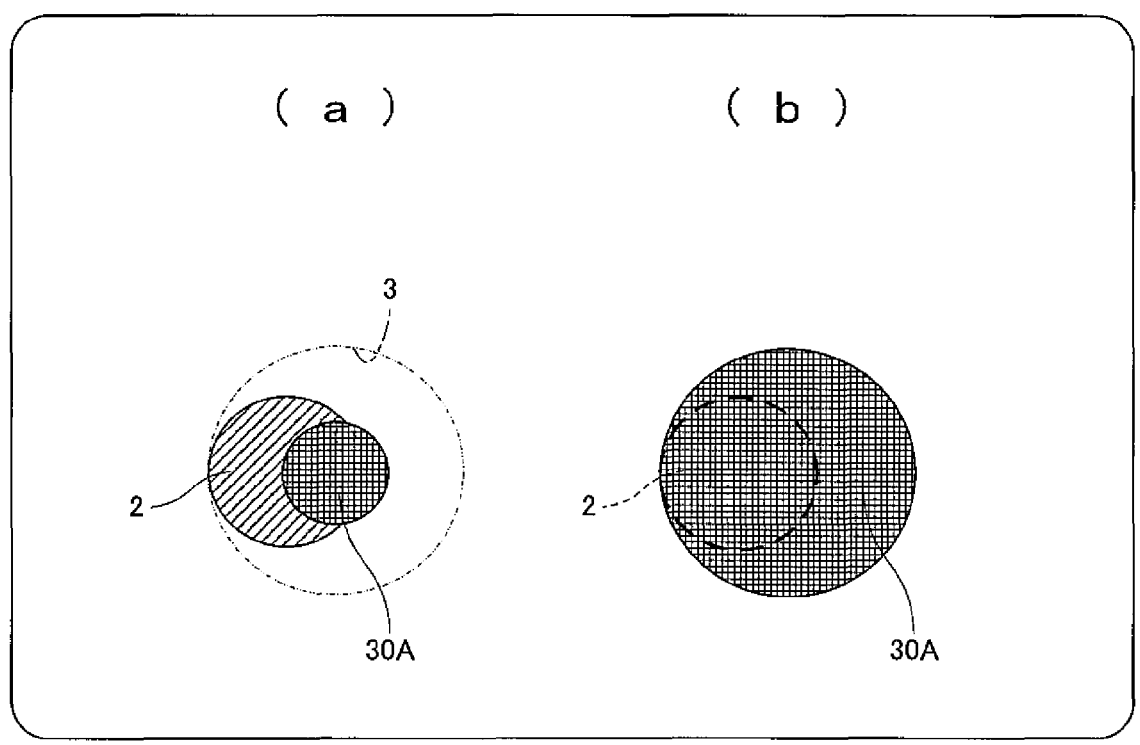
FIGS. 14(a) and 14(b) are enlarged plan views showing an unbonded portion and a normal joint of the semiconductor module of FIG. 12 as a transparent image viewed in the vertical direction.

In the case of an unbonded inter-substrate joint 30A in the cross section of FIG. 12 and the plan view of FIG. 13, for example, the solder of the inter-substrate joint 30A does not spread over the pad 15 exposed from the opening 3. Thus in a transmission inspection from above, an image of the partially overlapping circles of the inter-substrate joint 30A and the connection terminal 2 can be detected. FIGS. 14(a) and 14(b) are enlarged views of the examples of the two images.

As shown in FIG. 14(a), in the case of the unbonded inter-substrate joint 30A, an image of two circles partially overlapping each other is detected, whereas in a normal joint of FIG. 14(b), the connection terminal 2 is hidden behind the inter-substrate joint 30 and only one circle is confirmed. Thus an unbonded state and a bonded state can be distinguished from each other at first sight.

The following will further describe FIGS. 14(a) and 14(b).

In the case of the unbonded state of FIG. 14(a), the inter-substrate joint 30A and the connection terminal 2 are placed inside the pad 15 exposed from the opening 3. In the case of the normal joint of FIG. 14(b), the connection terminal 2 is placed on the outer periphery of the pad 15 exposed from the opening 3.

An unbonded state can be easily recognized when the inter-substrate joint 30 and the connection terminal 2 can be separately observed. More preferably, the inter-substrate joint 30 and the connection terminal 2 are provided on a straight line. An unbonded state can be more easily recognized particularly when the inter-substrate joint 30 circumscribes the connection terminal 2 on the outer periphery of the pad 15 exposed from the opening 3.

Hence, in an X-ray inspection conducted from above, an unbonded joint is observed with substantially the same diameter as the inter-substrate joint 30 and a normal joint is observed with an outside shape as large as the pad 15 exposed from the opening 3 instead of the diameter of the inter-substrate joint 30. Thus an unbonded state and a bonded state can be clearly distinguished from each other.

Particularly in a stacked state, different shapes can be observed such that a normal joint is recognized as a single circle and an unbonded joint is recognized as two overlapping circles. Such a difference in shape facilitates the recognition of an unbounded joint.

When the connection terminal 2 is placed on the outer periphery of the pad 15 exposed from the opening 3, an overlap can be more clearly recognized.

When the inter-substrate joint 30 is placed on the outer periphery of the pad 15 exposed from the opening 3, an overlap can be more clearly recognized.

When the connection terminal 2 is placed on the outer periphery of the pad 15 exposed from the opening 3 and the inter-substrate joint 30 is placed on the outer periphery of the pad 15 exposed from the opening 3, an overlap can be more clearly recognized.

The positional relationship between the connection terminal 2 and the inter-substrate joint 30 is applicable to the overall substrate. The positional relationship may not be applied to a part of the substrate but it is preferable to apply the positional relationship to the overall substrate.

Figure 15:
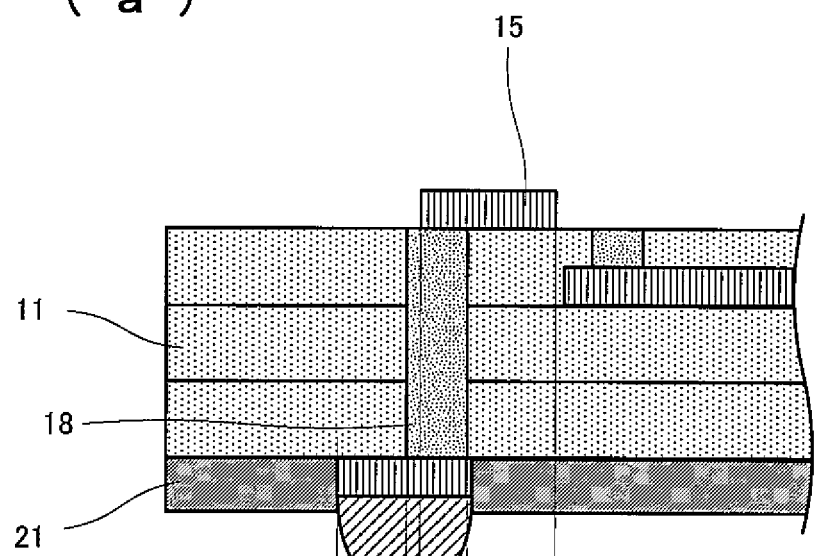
FIGS. 15(a) and 15(b) are an enlarged sectional view and a plan view showing a principle part according another specific example of the present invention.
Figure 15:
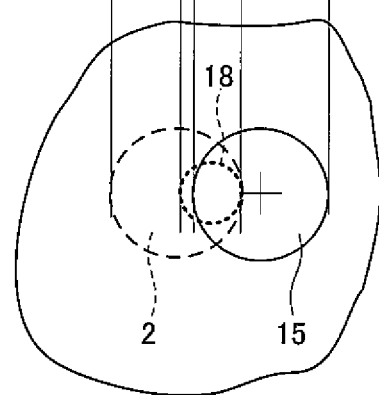
Figure 16:
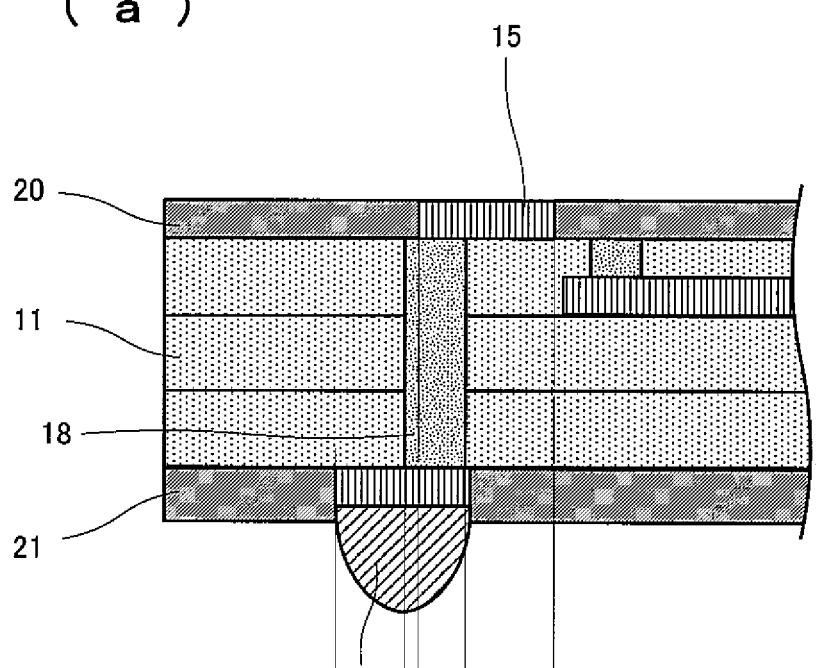
FIGS. 16(a) and 16(b) are an enlarged sectional view and a plan view showing a principle part according another specific example of the present invention.
Figure 16:
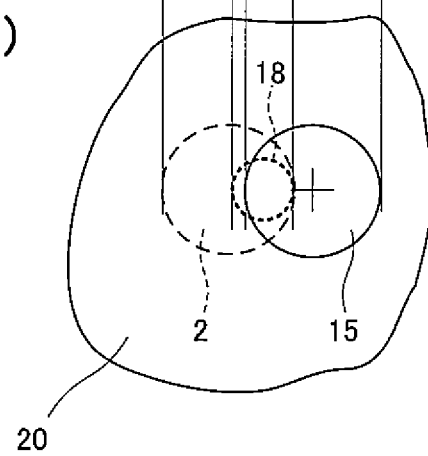
Figure 17A:
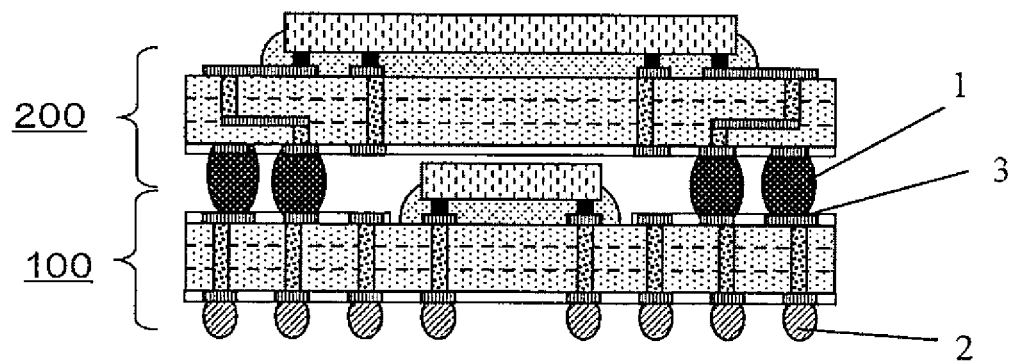
FIG. 17A is a sectional view showing a semiconductor module described in patent document 1.
Figure 17B:
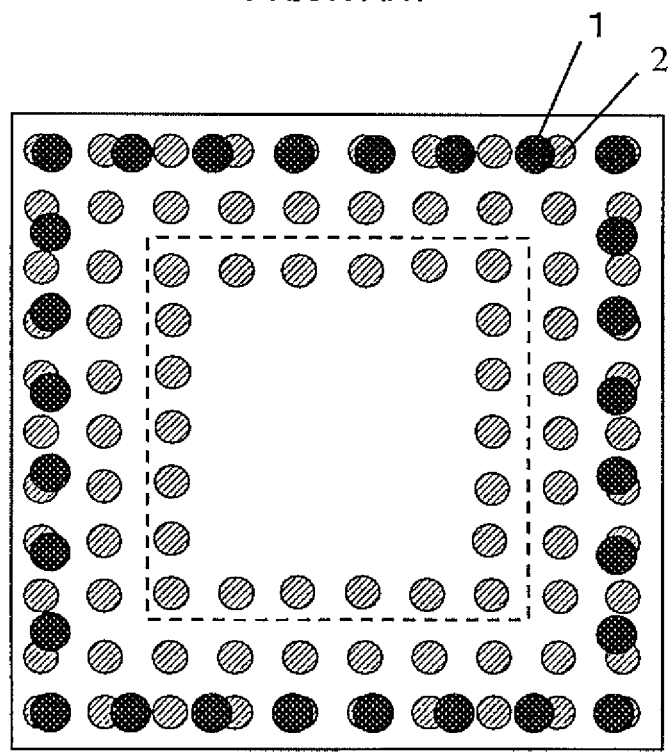
FIG. 17B is a plan view showing a transparent image of the semiconductor module in patent document 1 from above the semiconductor module.
Figure 18A:
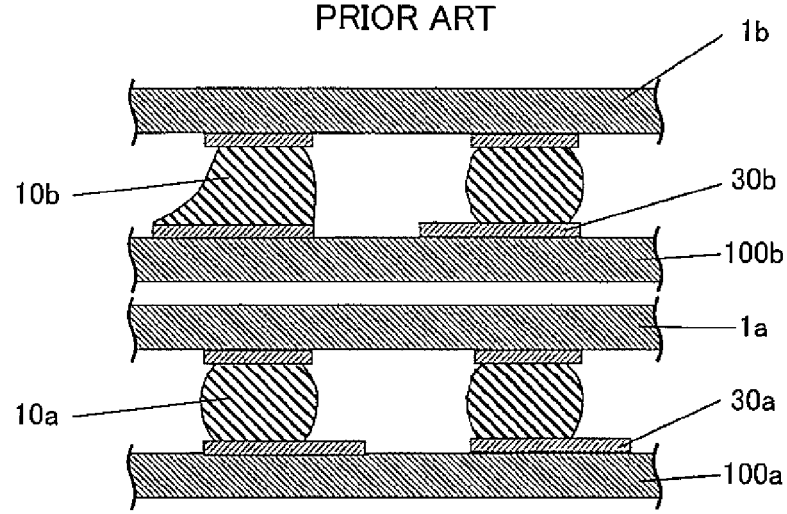
FIG. 18A is a sectional view showing a semiconductor module described in patent document 2.
Figure 18B:
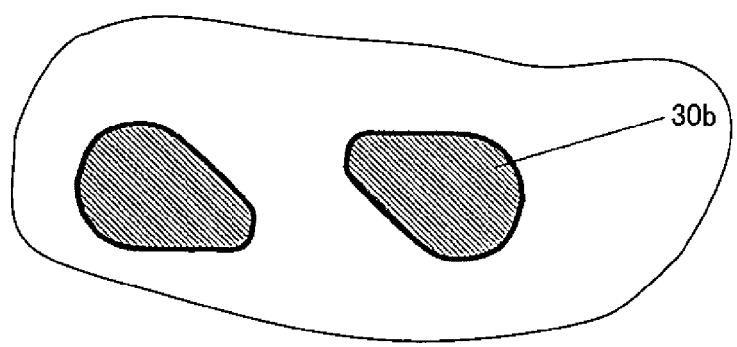
FIG. 18B is a plan view showing electrode pads 30b of the semiconductor module described in patent document 2.
Figure 18C:
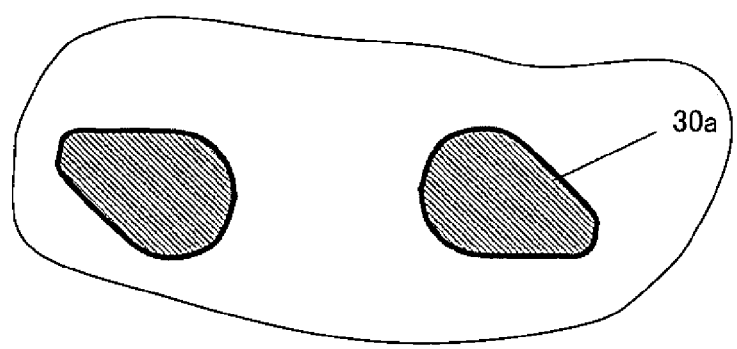
FIG. 18C is a plan view showing electrode pads 30a of the semiconductor module described in patent document 2.

The pads 15 of the foregoing embodiments are larger in width than the dimensions of soldering to the inter-substrate joints 30. Thus the pads 15 are covered with the insulating film 20, the openings 3 are formed on the insulating film 20 according to the dimensions of soldering to partially expose the pads 15, and the pads 15 are solder bonded to the inter-substrate joints 30. As shown in FIGS. 15(a) and 15(b), when the pad 15 with the dimensions of soldering is independently formed at a solder bonding position to the inter-substrate joint 30 on the substrate 11, the insulating film 20 is not necessary in this part. When the pads 15 with the dimensions of soldering are independently formed thus, the pads 15 are connected to the connection terminals 2 and other electric circuits in the substrate 11. As shown in FIGS. 16(a) and 16(b), the insulating film 20 may be provided around the pad 15.

The present invention contributes to improvement in the reliability of small devices and various kinds of compact electronic equipment such as a cellular phone, a digital still camera, and a video camera.

What is claimed is:

1. A semiconductor module comprising:
a first semiconductor package comprising:
a first substrate;
a first semiconductor chip flip-chip mounted on a first surface of the first substrate;
a plurality of inter-substrate connection pads on the first surface of the first substrate;
a plurality of first pads for external connection terminals on a second surface of the first substrate, which is opposite to the first surface;
a plurality of external connection terminals formed on the plurality of first pads on the second surface of the first substrate; and
a plurality of vias electrically connecting the plurality of inter-substrate connection pads and the plurality of external connection terminals;
a second semiconductor package comprising:
a second substrate;
a second semiconductor chip flip-chip mounted on a first surface of the second substrate; and
a plurality of inter-substrate joints provided on a second surface of the second substrate, which is opposite to the first surface of the second substrate, so as to be connected to the plurality of inter-substrate connection pads,
wherein in a radiographic plane viewed in a vertical direction relative to the first surface of the second substrate, a whole region of every one of the plurality of vias is respectively within an area of intersection of one of the plurality of inter-substrate joints and one of the plurality of first pads for external connection terminals on the second surface of the first substrate, and all of the centers of the plurality of inter-substrate joints are exposed from the plurality of external connection terminals on the second surface of the first substrate.

2. The semiconductor module according to claim 1, wherein all of the plurality of inter-substrate joints and all of the plurality of external connection terminals are displaced from each other by a constant distance.

3. The semiconductor module according to claim 1, wherein all of the plurality of inter-substrate joints and all of the plurality of external connection terminals are displaced in the same direction.

4. The semiconductor module according to claim 1, wherein the plurality of inter-substrate joints and the plurality of external connection terminals are differently shaped.

5. The semiconductor module according to claim 1, wherein cross-sectional areas of the plurality of inter-substrate joints and the plurality of external connection terminals are equally sized.

6. The semiconductor module according to claim 1, wherein all of the plurality of vias connect the plurality of inter-substrate connection pads and the plurality of external connection terminals in a straight line.

7. A semiconductor module comprising:
a first semiconductor package comprising:
a first substrate;
a first semiconductor chip flip-chip mounted on a first surface of the first substrate;
a plurality of inter-substrate connection pads on the first surface of the first substrate;
a plurality of first pads for external connection terminals on a second surface of the first substrate, which is opposite to the first surface;
a plurality of external connection terminals formed on the plurality of first pads on the second surface of the first substrate; and
a plurality of vias electrically connecting the plurality of inter-substrate connection pads and the plurality of external connection terminals;
a second semiconductor package comprising:
a second substrate;
a second semiconductor chip flip-chip mounted on a first surface of the second substrate; and
a plurality of inter-substrate joints provided on a second surface of the second substrate, which is opposite to the first surface of the second substrate, so as to be connected to the plurality of inter-substrate connection pads,
wherein in a radiographic plane viewed in a vertical direction relative to the first surface of the second substrate, a whole region of every one of the plurality of vias is respectively within an area of intersection of one of the plurality of inter-substrate joints and one of the plurality of first pads for external connection terminals on the second surface of the first substrate, and all of the centers of the plurality of external connection terminals on the second surface of the first substrate are exposed from the plurality of inter-substrate joints.

8. The semiconductor module according to claim 7, wherein all of the plurality of inter-substrate joints and all of the plurality of external connection terminals are displaced from each other by a constant distance.

9. The semiconductor module according to claim 7, wherein all of the plurality of inter-substrate joints and all of the plurality of external connection terminals are displaced in the same direction.

10. The semiconductor module according to claim 7, wherein the plurality of inter-substrate joints and the plurality of external connection terminals are differently shaped.

11. The semiconductor module according to claim 7, wherein cross-sectional areas of the plurality of inter-substrate joints and the plurality of external connection terminals are equally sized.

12. The semiconductor module according to claim 7, wherein all of the plurality of vias connect the plurality of inter-substrate connection pads and the plurality of external connection terminals in a straight line.

13. A semiconductor module comprising:
a first semiconductor package comprising:
a first substrate;
a first semiconductor chip flip-chip mounted on a first surface of the first substrate;
a plurality of inter-substrate connection pads on the first surface of the first substrate;
a plurality of first pads for external connection terminals on a second surface of the first substrate, which is opposite to the first surface;
a plurality of external connection terminals formed on the plurality of first pads on the second surface of the first substrate; and
a plurality of vias electrically connecting the plurality of inter-substrate connection pads and the plurality of external connection terminals;
a second semiconductor package comprising:
a second substrate;
a second semiconductor chip flip-chip mounted on a first surface of the second substrate; and a plurality of inter-substrate joints provided on a second surface of the second substrate, which is opposite to the first surface of the second substrate, so as to be connected to the plurality of inter-substrate connection pads, wherein in a radiographic plane viewed in a vertical direction relative to the first surface of the second substrate, a whole region of every one of the plurality of vias is respectively within an area of intersection of one of the plurality of inter-substrate joints and one of the plurality of first pads for external connection terminals on the second surface of the first substrate, all of the centers of the plurality of inter-substrate joints are exposed from the plurality of the external connection terminals on the second surface of the first substrate and all of the centers of the plurality of external connection terminals on the second surface of the first substrate are exposed from the plurality of inter-substrate joints.

14. The semiconductor module according to claim 13, wherein all of the plurality of inter-substrate joints and all of the plurality of external connection terminals are displaced from each other by a constant distance.

15. The semiconductor module according to claim 13, wherein all of the plurality of inter-substrate joints and all of the plurality of external connection terminals are displaced in the same direction.

16. The semiconductor module according to claim 13, wherein the plurality of inter-substrate joints and the plurality of external connection terminals are differently shaped.

17. The semiconductor module according to claim 13, wherein cross-sectional areas of the plurality of inter-substrate joints and the plurality of external connection terminals are equally sized.

18. The semiconductor module according to claim 13, wherein all of the plurality of vias connect the plurality of inter-substrate connection pads and the plurality of external connection terminals in a straight line.

* * * * *